United States Patent [19]

Sakamoto et al.

[11] Patent Number: 5,668,643
[45] Date of Patent: Sep. 16, 1997

[54] RECORDING APPARATUS HAVING A TEXT PROCESSING MODE USING A THRESHOLD AND AN IMAGE PROCESSING MODE USING A MEAN VALVE OF PIXEL DATA SAMPLES AS THE PIXEL GRADATION VALVE

[75] Inventors: Masaki Sakamoto; Yuki Oishi; Hideki Yorozu; Kazutaka Suzuki, all of Iwate-ken, Japan

[73] Assignee: Alps Electric Co., Ltd., Tokyo, Japan

[21] Appl. No.: 653,918

[22] Filed: May 28, 1996

[30] Foreign Application Priority Data

Jun. 30, 1995 [JP] Japan .................................. 7-166253
Jun. 30, 1995 [JP] Japan .................................. 7-166255

[51] Int. Cl.⁶ .......................... H04N 1/403; H04N 1/407
[52] U.S. Cl. .......................... 358/455; 358/462; 358/465; 358/296
[58] Field of Search ................................ 358/455, 462, 358/465, 466, 456, 458, 459, 298, 429, 296; 382/237, 270, 272

[56] References Cited

U.S. PATENT DOCUMENTS 4,668,995 5/1987 Chen et al. ........................... 358/462

Primary Examiner—Scott A. Rogers
Attorney, Agent, or Firm—Guy W. Shoup; Patrick T. Bever

[57] ABSTRACT

A reading apparatus and a recording apparatus having the reading apparatus which can reduce storage capacity for storing read data and, because the read data processing modes can be switched according to the type of documents to be processed, perform fast and proper document reading operation. If a document to be processed is an image document, the controller operates in the image processing mode in which M pieces of read data are sampled out of N pieces of read data and a mean value of the M pieces of read data is calculated to be stored in the memory as gradation data of one pixel. If the document is a text document, the controller operates in the text processing mode in which read data of one read unit of the image scanner is digitized by a threshold to be stored in the memory. Switching between these two processing modes is performed by the conversion processing operator section in the controller.

4 Claims, 4 Drawing Sheets

RECORDING APPARATUS HAVING A TEXT PROCESSING MODE USING A THRESHOLD AND AN IMAGE PROCESSING MODE USING A MEAN VALVE OF PIXEL DATA SAMPLES AS THE PIXEL GRADATION VALVE

BACKGROUND OF THE INVENTION

1. Field of the Invention

The present invention relates to a recording apparatus equipped with an image scanner and, more particularly, to a recording apparatus equipped with an image scanner having a switching mechanism for selecting a different processing mode depending on whether a document to be processed is a text document or an image document.

2. Description of the Related Art

Recording apparatuses equipped with an image scanner supported by an image reader such as CCD (Charge Coupled Device) for example have been widely used. In such apparatuses, a document consisting of a color halftone image such as a photograph is read by such an image scanner. Based on color value data of three primary colors R (red), G (green), and B (blue) of the image data outputted from the scanner, color data of Y (yellow), M (magenta), and C (cyan), the recording signals for recorders such as a printer are generated by arithmetic operations. Based on the color value data of these colors, the recording head of the recorder is controlled to record the color image read by the image scanner.

In such prior-art recording apparatuses, reading of one pixel of a color halftone image is performed by reading an area consisting of one read unit of the image scanner. The read data are all stored in memory as gradation data. Based on the data stored in the memory, the recording by the recording apparatus is performed.

In the above-mentioned conventional recording apparatuses equipped with the image scanner, text documents are processed in the same manner as the above-mentioned color halftone image; that is, read data for each pixel are all stored in the memory as the gradation data in the read unit of the image scanner and, based on the stored data, the recording operation by the recording apparatus is performed.

However, as described above, the recording apparatus equipped with the image scanner requires to store the data read by the image scanner into the memory as gradation data regardless of whether the read data is obtained from a text or an image. Consequently, the memory of a large capacity is required to store data of one page or one scan, increasing the cost of the recording apparatus. Also, since the recording apparatus is controlled based on the read data, the processing of the read data takes time, preventing quick recording of images.

In addition, since the image recording is performed by converting the data read by the image scanner into a recording head control signal corresponding to the performance of the recording apparatus and the resolution of the recording head, the image scanner is required to deliver a capability which is always higher than a certain level regardless of the performance of the recording apparatus.

SUMMARY OF THE INVENTION

It is therefore an object of the present invention to provide a recording apparatus equipped with an image scanner which can perform a read operation quickly and properly by making relatively small a storage capacity of a memory in which read data is stored and making selection between read data converting modes according to the type of a document to be recorded.

It is another object of the present invention to provide a recording apparatus equipped with an image scanner, the recording apparatus having a controller for converting data read by the image scanner into record data to be sequentially stored in memory, the read data being for one pixel consisting of read data of N read units, or N pieces of read data. If the document to be processed is an image document, this controller samples given M pieces of data out of the above-mentioned N pieces of read data, calculates a mean value of the sampled M pieces of data, and stores the obtained mean value into the memory as the gradation data of one pixel.

It is another object of the present invention to provide a recording apparatus equipped with an image scanner wherein a total area S of the above-mentioned M pieces of read data has a relation of $S \geq 0.02$ mm$^2$.

It is another object of the present invention to provide a recording apparatus equipped with an image scanner wherein, if a document to be processed is text, the document is processed in test processing mode, namely, read data of one unit in which the reading of the image scanner is digitized based on a preset threshold to be stored in the memory. Thus, a conversion processing operator section is provided in the recording apparatus for selecting between the image processing mode and the text processing mode.

It is another object of the present invention to provide a recording apparatus equipped with an image scanner wherein, when the conversion processing operator section is switched to the image processing mode, the gradation data are stored in the memory in binary form.

According to the present invention, if a document to be processed is an image document, switching the conversion processing operator section to the image processing mode by the user allows the controller to sample given M pieces of read data out of the N pieces of data read by the image scanner, calculate the mean value of the sampled M pieces of read data, and store the obtained mean value in the memory as the record data of one pixel, resulting in a storage capacity of the memory which is 1/N of that of the prior-art counterpart. In this case, the image resolution becomes 1/N of the image resolution obtained by using all of N pieces of read data. Actually, however, the size of one pixel in which read processing is performed in units of N pieces of data is relatively extremely small, and the same processing is performed on each of the pixels, so that the read data is averaged over the entire image document, resulting in little degradation in image quality.

In addition, according to the present invention, the total area S of the M pieces of read data has a $S \geq 0.02$ mm$^2$, so that, when the M pieces of read data are sampled, a dot of a photo print always falls in the read data for one pixel, thereby lowering the unevenness (moiré) in density data that occurs when dots are skipped over periodically in reading.

The above and other objects, features and advantages of the present invention will become more apparent from the accompanying drawings, in which like reference numerals are used to identify the same or similar parts in several views.

DETAILED DESCRIPTION OF PREFERRED EMBODIMENTS

Figure 1:
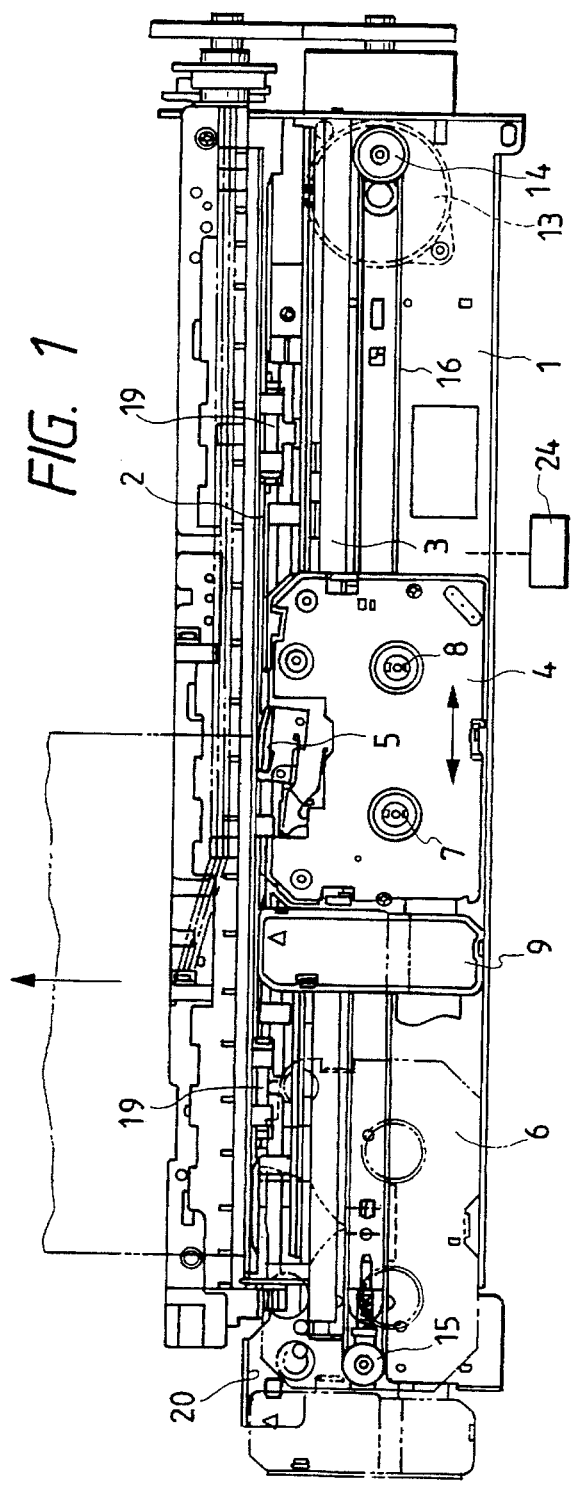
FIG. 1 is a plain view illustrating a thermal transfer printer practiced as one preferred embodiment of a recording apparatus equipped with an image scanner associated with the present invention.

This invention will be described in further detail by way of example with reference to the accompanying drawings.

FIGS. 1 through 4 show a recording apparatus having a reading apparatus associated with the present invention, practiced as one preferred embodiment thereof. A frame 1 of the recording apparatus is arranged with a plate-shaped platen 2 that extends along the length of the apparatus. Between both sides of the frame 1, a carriage shaft 3 is supported in front of the platen 2 and along the same in parallel. The carriage shaft 3 is reciprocally mounted with a carriage 4 along the same. The carriage 4 is mounted at an end thereof with a thermal head 5 in a movable manner toward and away from the platen 2. The carriage 4 is also detachably mounted at a top thereof with a ribbon cassette 6 for accommodating a ink ribbon, not shown, and guiding the same between the thermal head 5 and the platen 2. In addition, the carriage 4 is mounted at the top thereof with a take-up bobbin 7 for winding the ink ribbon in the ribbon cassette 6 and a supply bobbin 8 for supplying the ink ribbon.

Figure 2:
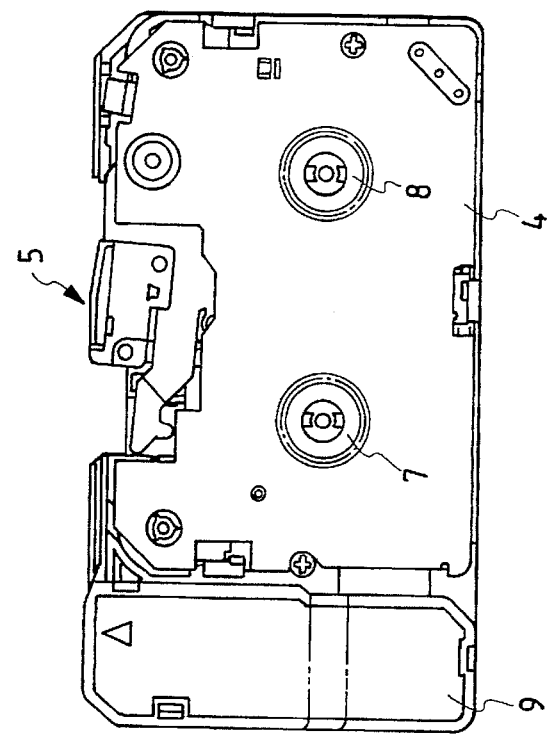
FIG. 2 is a plain view illustrating a constitution of a carriage of the thermal transfer printer of FIG. 1.
Figure 3:
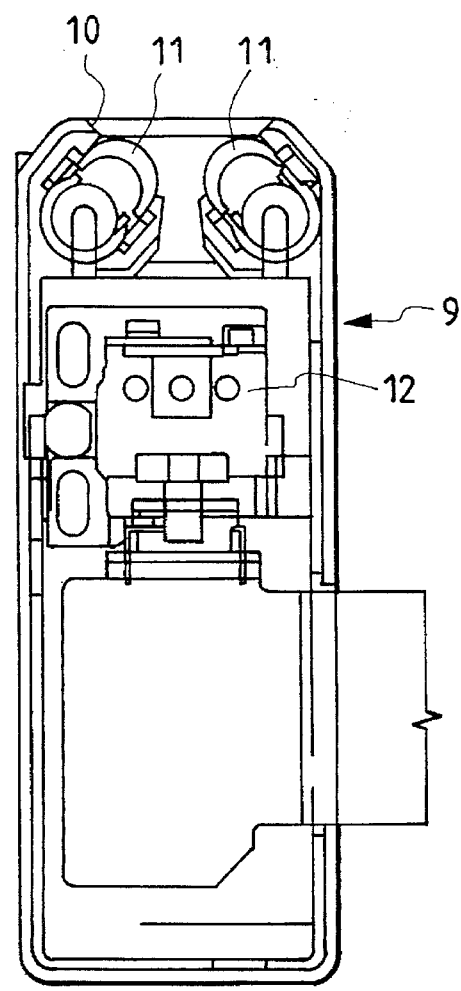
FIG. 3 is a plain view illustrating a constitution of the image scanner of the thermal transfer printer of FIG. 1.

In the present preferred embodiment, as shown in FIG. 2, the carriage 4 is arranged at one side thereof with an image scanner 9. As shown in FIG. 3, the image scanner 9 is formed at the side facing the platen 2 with an opening 10. The opening 10 is arranged at both sides hereof and inside the image scanner 9 with two light-emitting members 11, 11 such as lamps toward the opening 10. The image scanner 9 is internally arranged with an image sensor unit 12 for receiving the light emitted from the light-emitting member 11 and reflected from the document.

Referring to FIG. 1 again, the frame 1 is also arranged at the lower side of one end thereof with a carriage drive motor 13 such that an output shaft thereof penetrates the top of the frame 1. The output shaft of the carriage drive motor is attached with a drive pulley 14 to be rotatably driven by the carriage drive motor 13. Further, the frame 1 is arrange at the top of the other end thereof with a follower pulley 15 in a rotatable manner. A carriage drive belt 16 is mounted on the drive pulley 14 and the follower pulley 15, a portion thereof being linked to the underside of the carriage 4. When the carriage motor 13 is turned on to drive the carriage drive belt 16 via the drive pulley 14, the carriage 4 is reciprocally moved along the carriage shaft 3 in parallel to the platen 2.

Figure 4:
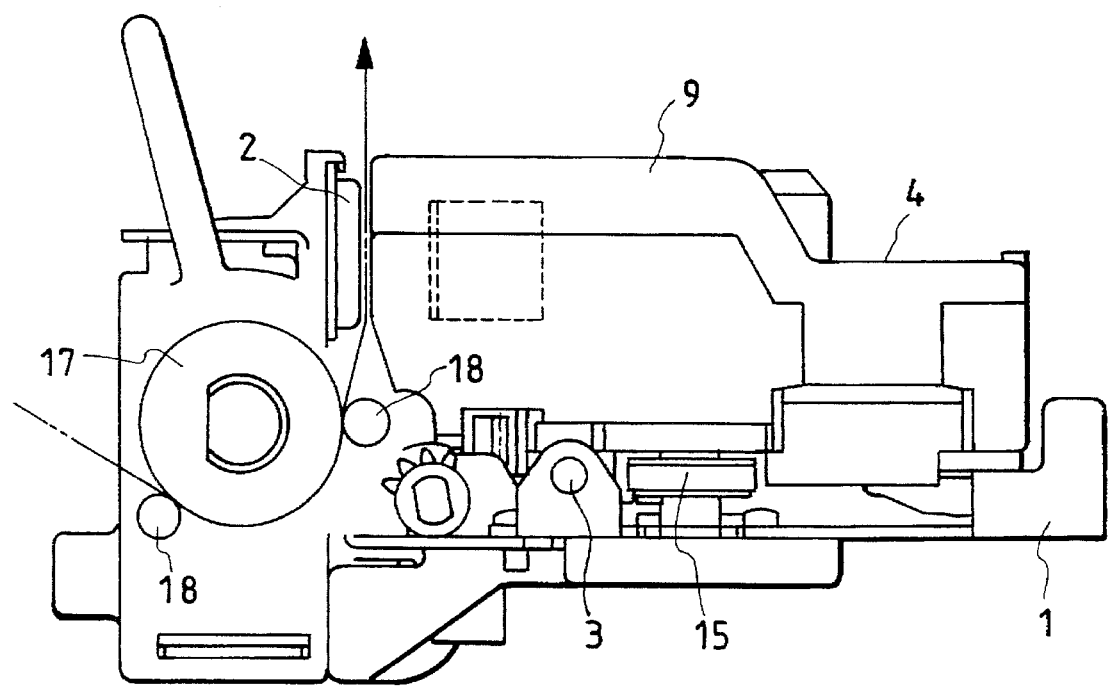
FIG. 4 is a side view illustrating states of the carriage and a sheet spring when a thermal head of the thermal transfer printer of FIG. 1 is pressed against a platen thereof.

Referring to FIG. 4, the platen 2 is arranged at the lower side of the rear thereof with a feed roller for feeding a predetermined recording medium at a predetermined speed. The feed roller 17 is arranged at the underside thereof with a plurality of press rollers 18 in a rotatable manner to be pressed against the feed roller 17. Further, the frame 1 is arranged at the rear thereof with a paper feeder, not shown. This paper feeder accommodates a document holder for holding a predetermined document and recording medium such as ordinary print paper or stencil print paper for example in an alternately stacked manner. When the feed roller 17 is rotatably driven, the document holder and the recording medium which are supplied between the feed roller 17 and the plurality of press rollers 18 are carried in between the thermal head 5 and the platen 2. In addition, the platen 2 is arranged at upside thereof with paper eject roller 19 for guiding out the printed recording medium.

The platen 2 of the frame 1 is formed at one side with a positioning marker 20. By reading this positioning marker 20 by the image scanner 9, the stop position of the carriage 4 is recognized.

Figure 5:
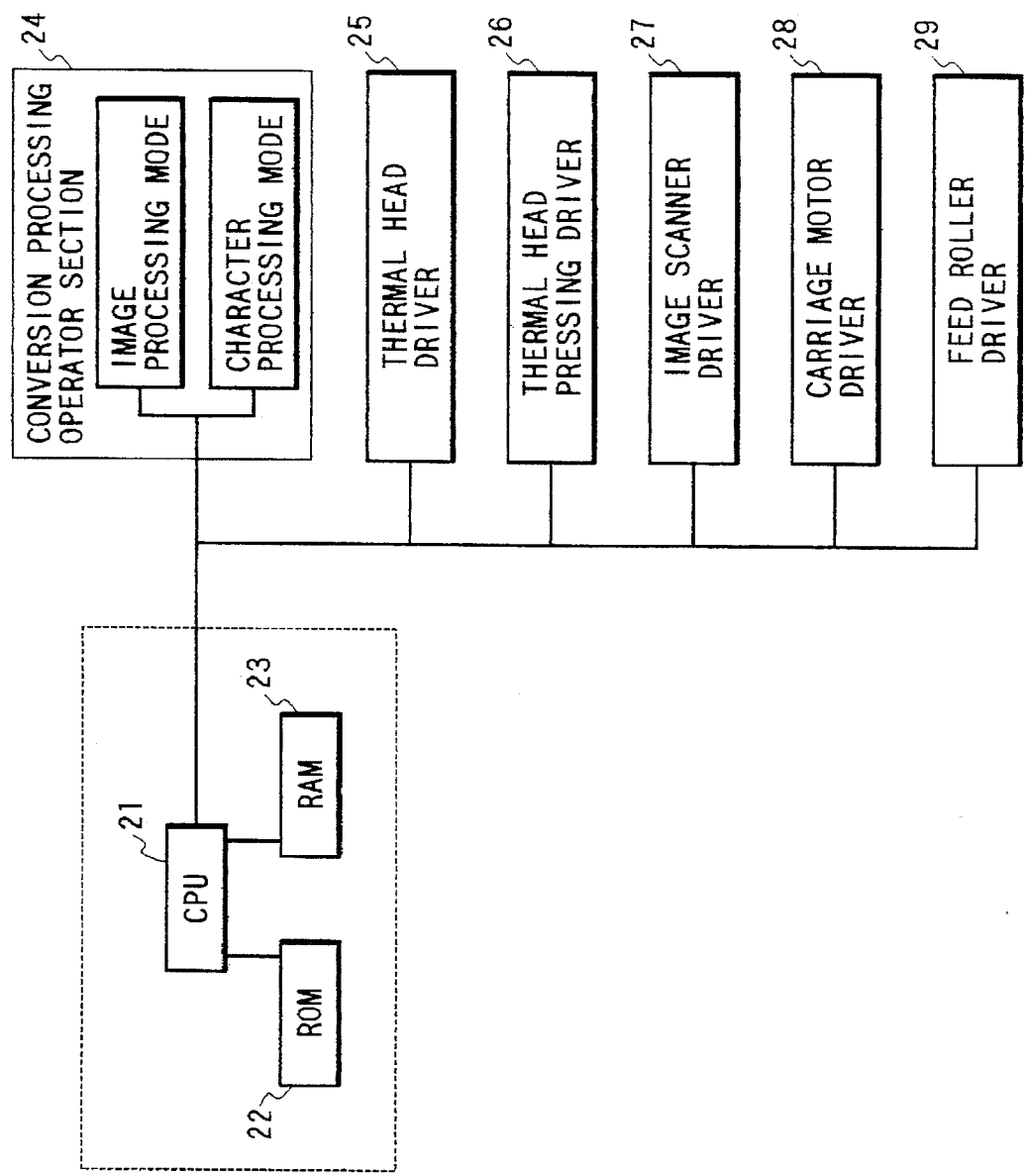
FIG. 5 is a block diagram illustrating a controller practiced as one preferred embodiment of the thermal transfer printer associated with the present invention.

FIG. 5 shows one preferred embodiment of a controller of the reading apparatus and the recording apparatus having the reading apparatus according to the present invention. A CPU (Central Processing Unit) 21 is connected with a ROM (Read Only Memory) 22 storing a condition of recording patterns corresponding to the number of gradations of density data, for example dither patterns, and a RAM (Random Access Memory) 23 storing various kinds of data. The CPU 21 is supplied with image information obtained by reading one pixel 31 of FIG. 7 by dividing the same by a predetermined divisor by the image scanner 14. The CPU 21 is also connected with a conversion processing operator section 24 from which the user sends a command that instructs the CPU in which processing mode this image information is to be processed. The conversion processing operator section 24 selects between the image processing mode and the text processing mode. The user can make selection of these modes as desired. The image processing mode is selected when the document to be processed contains image information such as a photograph that has a halftone image. In the image processing mode, the CPU 21 arbitrarily selects the predetermined number of pieces of read data from the read data which are gradation data for one pixel 31 consisting of N pieces of data sent from the above-mentioned image scanner. Then, the CPU 21 calculates a density gradation value in the one pixel 31 from the selected number of pieces of read data to store the result in the RAM 23 as one piece of density data. Therefore, the RAM 23 may only store one piece of density data for a range of the one pixel 31; that is, the RAM 23 may only have a storage capacity of 1/N of that of the conventional counterpart. Further, storing this density data in binary form can reduce the storage capacity of the RAM 23 to 1/4N. For example, if the density data is represented in 16 gradations, the storage capacity required of the RAM 23 is 16 bits; if each of the 16 gradations is represented in binary form, the density data can be represented in 24, thereby requiring the storage capacity of only four bits.

On the other hand, the text processing mode is selected when the document to be processed contains text information. In the text processing mode, the CPU 21 determines the read data which is the gradation data for one pixel 31 consisting of N pieces of read data sent from the image scanner simply as binary data of 0 (white) or 1 (black). The CPU calculates the number of pieces of binary data in one pixel 31. The CPU then determines whether the obtained number of pieces of binary data is larger or smaller than the predetermined number. Based on the result of this determination, the CPU determines whether the one pixel 31 is 0 (white) or 1 (black), or whether to record the one pixel 31 or not. The result is stored in the RAM 23.

The CPU 21 also sends control signals to a thermal head driver 25 for energizing the thermal head 10, a thermal head pressing driver 26 for pressing the thermal head 10 against the platen 7, an image scanner driver 27 for driving the image scanner 14, a carriage drive motor driver 28, and a feed roller driver 29.

The following describes operations of the above-mentioned preferred embodiment.

If the document to be processed is a halftone image such as a photograph, the user sets the conversion processing operator section 24 to the image processing mode. When the section 24 has been set to the image processing mode, the CPU 21 sends the control signals to the above-mentioned circuits such that the read data coming from the image scanner is converted into the density data to be recorded by the thermal head.

Figure 6:
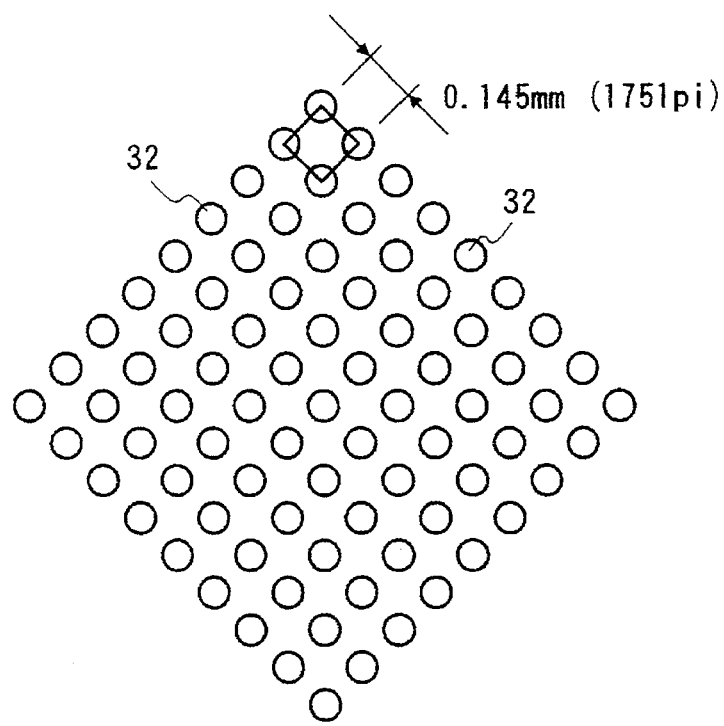
FIG. 6 is a diagram illustrating a pixel of a photo print image to which a method of read data processing in the image processing mode of the present invention is applied.
Figure 7:
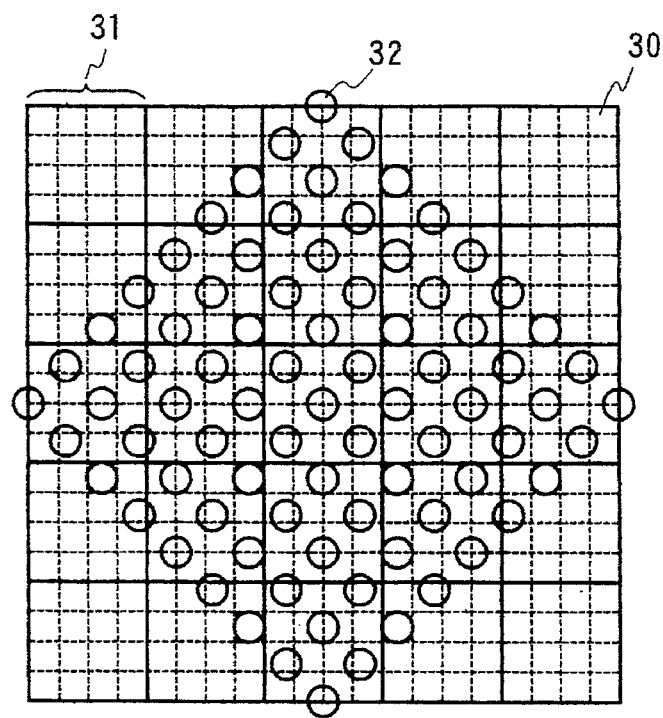
FIG. 7 is a diagram illustrating the method of read data processing in the image processing mode of the present invention.

The conversion processing in the image processing mode will be described more specifically with reference to FIGS. 6 and 7.

First, a predetermined document containing a halftone image is read by the image scanner. In the present embodiment, a range consisting of data of N read units 30, or N pieces of read data, to be read by the scanner is handled as one pixel 31. Each of said N pieces of read data is sent to the CPU 21 as the gradation data in the read unit of the image scanner. For example, in FIG. 7, a range of 16 units (4×4) provides one pixel 31.

Next, the CPU 21 samples a given M pieces of read data out of the above-mentioned N pieces of read data, calculates a mean value of the sampled M pieces of read data (indicated by hatched portions), and stores these read data into the RAM 23. For example, if the given number pieces of read data is eight, the CPU calculates the mean value over these eight pieces of read data. Based on the obtained mean value, the CPU calculates the gradation of the density and stores the obtained gradation value in the RAM 23 in binary form.

It should be noted that the above-mentioned M has a relation $M \leq N$ and the total area S of M read ranges is set to $S \geq 0.02$ mm$^2$ for the following reason. When reading an image of a printed photograph in a magazine for example by the image scanner, the image of the printed photograph is normally formed by a collection of microscopic dots 32. Therefore, when a given M pieces of image data are sampled, image data only in the spaces between the dots of the above-mentioned printed photograph are sampled, possibly causing the CPU to determine that no image is found in the portion of this one pixel 31. To prevent this from happening, the total area S of M read ranges is set to a value lager than the area between dots 32, by which, when sampling M pieces of image data, the image data in each dot 32 portion on the printed photograph are always sampled. To be more specific, a normal resolution of printed photographs is about 1751 pi, the distance between dots 32 being about 0.145 mm. Therefore, the area formed by four dots is 0.02 mm$^2$ (0.145 mm×0.145 mm). Hence, $S \geq 0.02$ mm$^2$.

If the image is recorded by the recording apparatus based on the image data read as above, the CPU 21 selects a dither pattern preset for each gradation stored in the ROM 22 in correspondence to the gradation data of the read data stored in the RAM 23. Based on the selected dither pattern, the CPU calculates the control signal for the thermal head.

Then, the CPU outputs the thermal head control signal to the thermal head driver 25 and the thermal head pressing driver 26 to operate the thermal head to record the data on a predetermined paper or the like.

In this case, in the present embodiment, the actual N pieces of read data are represented by M pieces of read data for the one pixel 31 and the mean value of the M pieces of read data are regarded as the N pieces of read data, so that the image resolution obtained is 1/N of that obtained by using all N pieces of read data. In practice, however, the size of the one pixel 31 with N pieces of read data used as the read unit 30 is about 0.4 mm square and the same processing is performed on each of the pixels, so that the read data are averaged over the entire document image, preventing an extreme degradation of the image from occurring.

In the present embodiment, the total area S of the M read ranges is set to $S \geq 0.02$ mm$^2$, so that, when M pieces of read data are sampled, the dot 32 of the printed photograph always falls in the read data for the one pixel 31. This reduces the unevenness in the density data (moiré) that is caused by skipping the dots 32 periodically in reading. Further, setting of $S \geq 0.02$ mm$^2$ can average the fluctuations of the gradation data more than regularly selecting the gradation data from the N pieces of read ranges, resulting in the read data more true to the original document.

On the other hand, if the document to be processed is of text information, the user switches the conversion processing operator section 24 to the text processing mode. When the section 24 has been switched to the text processing mode, the CPU 21 converts the read data supplied from the image scanner into binary data and sends the control signals to the related circuits to record the data by the thermal head.

To be more specific, a predetermined text document is read by the image scanner. The resultant gradation data in the read unit 30 is sent to the CPU 21. The CPU 21 then determines that the read data composed of gradation data are binary data of simply 0 (white) or 1 (black) based on the predetermined threshold and stores the binary data in the RAM 23.

When recording the text data by the recording apparatus based on the binary data, the CPU 21 outputs a control signal to the thermal head driver 25 and the thermal head pressing driver 26, the control signal indicating whether to call the binary data from the RAM 23 to be recorded without change or not to be recorded at all. Based on this control signal, the thermal head is operated for recording.

Consequently, in the present embodiment, the read data processing mode can be set to the text processing mode or the image processing mode according to the type of the document to be processed. At the same time, in the image processing mode, the gradation data are sampled to calculate a mean value to provide the gradation data of the one pixel 31, which is stored in the RAM 23 in binary form. This novel constitution requires a significantly small storage capacity of the RAM 23 as compared with that of the conventional counterpart, thereby lowering the fabrication cost.

While the preferred embodiments of the present invention have been described using specific terms, such description is for illustrative purposes only, and it is to be understood that changes and variations may be made without departing from the spirit or scope of the appended claims.

For example, the present invention is applicable with the same advantages as mentioned above if the document to be read by the image scanner contains a color image.

As described and according to the present invention, the above-mentioned reading apparatus and the above-mentioned recording apparatus equipped with this reading apparatus require only the memory device of a significantly small storage capacity as compared with the conventional counterpart, thereby providing advantages such as the significantly reduced fabrication cost.

What is claimed is:

1. A recording apparatus comprising:

an image scanner for reading a document;

a controller for converting read data for one pixel composed of read data of N read units read by said image scanner into recording data and sequentially storing said recording data into a memory; and a recording head to be controlled based on said recording data stored in said memory;

wherein, if said document is an image document, said controller has an image processing mode in which given M pieces of read data out of said read data of N read units are sampled, a mean value of the sampled M pieces of read data is calculated, and the calculated mean value is stored in said memory as gradation data of one pixel.

2. A recording apparatus according to claim 1 wherein a total area S of ranges of said M pieces of read data has a relation $S \geq 0.02$ mm$^2$.

3. A recording apparatus according to claim 1 wherein, when said document is a text document, said controller performs control based on a text processing mode in which read data of one read unit of said image scanner is digitized by a predetermined threshold to be stored in said memory and said controller has a conversion processing operator section for selecting either said image processing mode or said text processing mode.

4. A recording apparatus according to claim 3 wherein, if said conversion processing operator section has been switched to said image processing mode, said gradation data are stored in said memory in binary form.

* * * * *

UNITED STATES PATENT AND TRADEMARK OFFICE
CERTIFICATE OF CORRECTION

PATENT NO. : 5,668,643
DATED : September 16, 1997
INVENTOR(S) : Masaki Sakamoto et al.

It is certified that error appears in the above-indentified patent and that said Letters Patent is hereby corrected as shown below:

In the Title Page

In column 1, line 4, replace "VALVE" with --VALUE--.

In column 1, line 6, replace "VALVE" with --VALUE--.

In column 1, line 1, "under "Foreign Application Priority Data", replace "7-166253" with --7-166256--.

Signed and Sealed this

Eighth Day of December, 1998

Attest:

BRUCE LEHMAN

Attesting Officer

Commissioner of Patents and Trademarks